(12) United States Patent
Nguyen et al.

(10) Patent No.: US 7,265,437 B2
(45) Date of Patent: Sep. 4, 2007

(54) LOW K DIELECTRIC CVD FILM FORMATION PROCESS WITH IN-SITU IMBEDDED NANOLAYERS TO IMPROVE MECHANICAL PROPERTIES

(75) Inventors: Son V. Nguyen, Yorktown Heights, NY (US); Sarah L. Lane, Wappingers Falls, NY (US); Eric G. Liniger, Sandy Hook, CT (US); Kensaku Ida, Wappingers Falls, NY (US); Darryl D. Restaino, Modena, NY (US)

(73) Assignees: International Business Machines Corporation, Armonk, NY (US); Sony Corporation, Tokyo (JP)

( * ) Notice: Subject to any disclaimer, the term of this patent is extended or adjusted under 35 U.S.C. 154(b) by 150 days.

(21) Appl. No.: 10/906,815

(22) Filed: Mar. 8, 2005

(65) Prior Publication Data
US 2006/0202311 A1    Sep. 14, 2006

(51) Int. Cl.
*H01L 21/58* (2006.01)
(52) U.S. Cl. ............... 257/637; 257/760; 257/E23.164; 257/E23.019
(58) Field of Classification Search ........ 257/758–760, 257/636–637, 639–642, E23.019, E23.164
See application file for complete search history.

(56) References Cited

U.S. PATENT DOCUMENTS

| | | | |
|---|---|---|---|
| 6,316,167 B1 | 11/2001 | Angelopoulos et al. | |
| 6,518,646 B1 | 2/2003 | Hopper et al. | |
| 6,703,324 B2 | 3/2004 | Wong | |
| 6,713,874 B1 | 3/2004 | Hopper et al. | |
| 2001/0004550 A1* | 6/2001 | Passemard | 438/618 |
| 2002/0115285 A1 | 8/2002 | Wong | |
| 2003/0234450 A1* | 12/2003 | Grill et al. | 257/759 |
| 2004/0137153 A1* | 7/2004 | Thomas et al. | 427/384 |
| 2004/0157436 A1 | 8/2004 | Wong | |
| 2005/0179135 A1* | 8/2005 | Kumar | 257/758 |

\* cited by examiner

*Primary Examiner*—Thanhha S. Pham
(74) *Attorney, Agent, or Firm*—Scully, Scott, Murphy & Presser, P.C.; Todd M.C. Li, Esq.

(57) ABSTRACT

A low k dielectric stack having an effective dielectric constant k, of about 3.0 or less, in which the mechanical properties of the stack are improved by introducing at least one nanolayer into the dielectric stack. The improvement in mechanical properties is achieved without significantly increasing the dielectric constant of the films within the stack and without the need of subjecting the inventive dielectric stack to any post treatment steps. Specifically, the present invention provides a low k dielectric stack that comprises at least one low k dielectric material and at least one nanolayer present within the at least one low k dielectric material.

16 Claims, 3 Drawing Sheets

LOW K DIELECTRIC CVD FILM FORMATION PROCESS WITH IN-SITU IMBEDDED NANOLAYERS TO IMPROVE MECHANICAL PROPERTIES

FIELD OF THE INVENTION

The present invention relates to a dielectric stack that is comprised of one or more dielectric materials, each having a low dielectric constant on the order of about 3.0 or less, preferably about 2.7 or less, in which one or more nanolayers are present in at least one of the dielectric materials. The presence of the nanolayer improves the mechanical properties of the dielectric materials within the stack. The present invention also relates to semiconductor structures such as interconnect structures that include the inventive dielectric stack. The present invention also relates to a method of fabricating the inventive dielectric stack.

BACKGROUND OF THE INVENTION

In the production of microelectronic devices, integrated circuits utilize multilevel wiring structures for interconnecting regions within devices and for interconnecting one or more devices within integrated circuits. Conventionally, forming interconnect structures begins with forming a lower level of wiring followed by the deposition of an interlevel dielectric layer and then a second level of wiring, where the first and second wiring levels may be connected by one or more metal filled vias.

Interlevel and/or intralevel dielectrics (ILDs), such as silicon dioxide ($SiO_2$), are used to electrically isolate active elements and different interconnect signal paths from each other. The electrical connections between different interconnect levels are made through vias that are formed in the ILD layers. Typically, the vias are filled with a metal, such as copper, aluminum or tungsten.

Recently, there has been great interest to replace $SiO_2$ with low dielectric constant ("low k") materials as the intralevel and/or interlevel dielectrics in interconnect structures. By "low k" it is meant a dielectric material (organic or inorganic) having a dielectric constant that is less than silicon dioxide (e.g., k of less than about 4.0, as measured in a vacuum). Examples of low k materials include: organic dielectrics containing atoms of C, O and H such as thermosetting polyarylene ethers; and inorganic dielectrics containing atoms of Si, O and H, with C being optional. Examples of the latter include carbon doped oxides (also referred to as "SiCOH"), silsesquioxanes, organosilanes and other like Si-containing materials.

It is desirable to employ low k materials as insulators in interconnect structures because low k materials reduce the interconnect capacitance. Accordingly, low k materials increase the signal propagation speed, while reducing crosstalk noise and power dissipation in the interconnect structure.

The main problem with low k materials is that they lack mechanical rigidity and easily crack when subjected to thermal and mechanical stresses. That is, prior art low k dielectrics exhibit high crack velocity (on the order of about 1E-10 m/sec or greater at a film thickness of 1.2 μm) and stress (on the order of about 60 MPa or greater), while exhibiting low modulus (on the order of about 7.5 GPa or less) and hardness (on the order of about 1 GPa or less). These mechanical properties become poorer as the dielectric constant of the material is decreased. For instance, the crack velocity, stress, modulus and hardness of a porous low k material are worse than its corresponding nonporous low k material.

Poor mechanical properties of low k dielectrics may lead to device failure or degradation over extended periods of time. For example, dielectric films that have a high crack velocity have a high tendency to form cracks within said film during further processing and use, which greatly reduces the reliability of the semiconductor device that includes such films.

Improved mechanical properties of low k dielectrics have been achieved in the prior art by treating the films post deposition. For example, curing or treatment using thermal, UV light, electron beam irradiation, chemical energy or a combination of these has been used to stabilize the low k dielectric material and to improve the mechanical properties of the same. While such post deposition treatments are possible, they add extra processing steps and thus cost to the manufacturing of the dielectric film.

The above problem with crack formation is not only limited to low k dielectrics, but instead it applies to other materials which become fragile when they are subjected to thermal and mechanical stresses.

In view of the above, there is a need for providing a dielectric stack wherein the mechanical properties such as crack velocity, stress, modulus and hardness are improved without the need of subjecting the dielectric stack to any post deposition treatments.

SUMMARY OF THE INVENTION

The present invention provides a low k dielectric stack having an effective dielectric constant k, of about 3.0 or less, preferably about 2.7 or less, in which the mechanical properties of the stack are improved without significantly increasing the dielectric constant of the films within the stack. The improvement in mechanical properties is achieved without the need of subjecting the inventive dielectric stack to any post treatment steps.

Specifically, the present invention provides a low k dielectric stack that comprises at least one low k dielectric material and at least one nanolayer present within the at least one low k dielectric material. The term "nanolayer" is used in the present invention to denote a layer whose thickness is in the nanometer range.

The nanolayers of the present invention are formed in-situ and they typically include atoms of at least Si and O, with atoms of C, H, and N being optional. Illustrative examples of nanolayers of the present invention include, but are not limited to: SiCOH, SiCOHN, $SiO_2$, SiCOH, SiON, $SiCO_x$ or multilayers thereof.

In broad terms, the present invention provides a dielectric stack that comprises at least one low k dielectric material having a dielectric constant of about 3.0 or less and at least one nanolayer comprising at least atoms of Si and O present within the at least one low k dielectric material.

The present invention also relates to electronic structures such as interconnect structures that include the inventive dielectric film as the interlevel or intralevel dielectric, a capping layer, and/or as a hardmask/polish stop layer.

Specifically, the electronic structure of the present invention includes a pre-processed semiconducting substrate that has a first region of metal embedded in a first layer of insulating material, a first region of conductor embedded in a second layer of insulating material, the second layer of insulating material being in intimate contact with the first layer of insulating material, the first region of conductor being in electrical communication with the first region of metal, and a second region of conductor being in electrical communication with the first region of conductor and being embedded in a third layer of insulating material, the third layer of insulating material being in intimate contact with the second layer of insulating material.

In the above structure, each of the insulating layers can comprise the inventive low k dielectric stack.

The electronic structure may further include a dielectric cap layer situated in-between the first layer of insulating material and the second layer of insulating material, and may further include a dielectric cap layer situated in-between the second layer of insulating material and the third layer of insulating material. The electronic structure may further include a first dielectric cap layer between the second layer of insulating material and the third layer of insulating material, and a second dielectric cap layer on top of the third layer of insulating material.

In some embodiments, the dielectric cap itself can comprise the inventive low k dielectric stack.

The electronic structure may further include a diffusion barrier layer of a dielectric material deposited on at least one of the second and third layer of insulating material. The electronic structure may further include a dielectric layer on top of the second layer of insulating material for use as a RIE hard mask/polish-stop layer and a dielectric diffusion barrier layer on top of the dielectric RIE hard mask/polish-stop layer. The electronic structure may further include a first dielectric RIE hard mask/polish-stop layer on top of the second layer of insulating material, a first dielectric RIE diffusion barrier layer on top of the first dielectric polish-stop layer a second dielectric RIE hard mask/polish-stop layer on top of the third layer of insulating material, and a second dielectric diffusion barrier layer on top of the second dielectric polish-stop layer. The dielectric RIE hard mask/polish-stop layer may be comprised of the inventive low k dielectric stack as well.

The present invention also relates to a method of fabricating the inventive dielectric stack. Specifically, the method of the present invention includes:

providing a substrate into a reactor chamber; and depositing a low k dielectric film onto a surface of said substrate from at least a first dielectric precursor, wherein during said depositing said first dielectric precursor is changed into a nanolayer precursor whereby at least one nanolayer comprising atoms of at least Si and O is introduced to the low k dielectric film.

It should be noted that the present invention also contemplates other material stacks besides those including low k dielectrics. In that instance, the present invention provides a material stack comprising one or more films that have a crack velocity of about 1E-10 m/sec or greater and at least one monolayer within said one or more films, said one at least one monolayer reduces said crack velocity of said one or more films to a value of less than 1E-10 m/sec.

In this embodiment, the stack is made using the method described above except that the first dielectric precursor is replaced with a first material precursor. For example, a metal stack formed on a metal oxide substrate can be provided in which the metal stack is comprised of Au deposited from an Au-containing precursor.

DETAILED DESCRIPTION OF THE INVENTION

Figure 1:
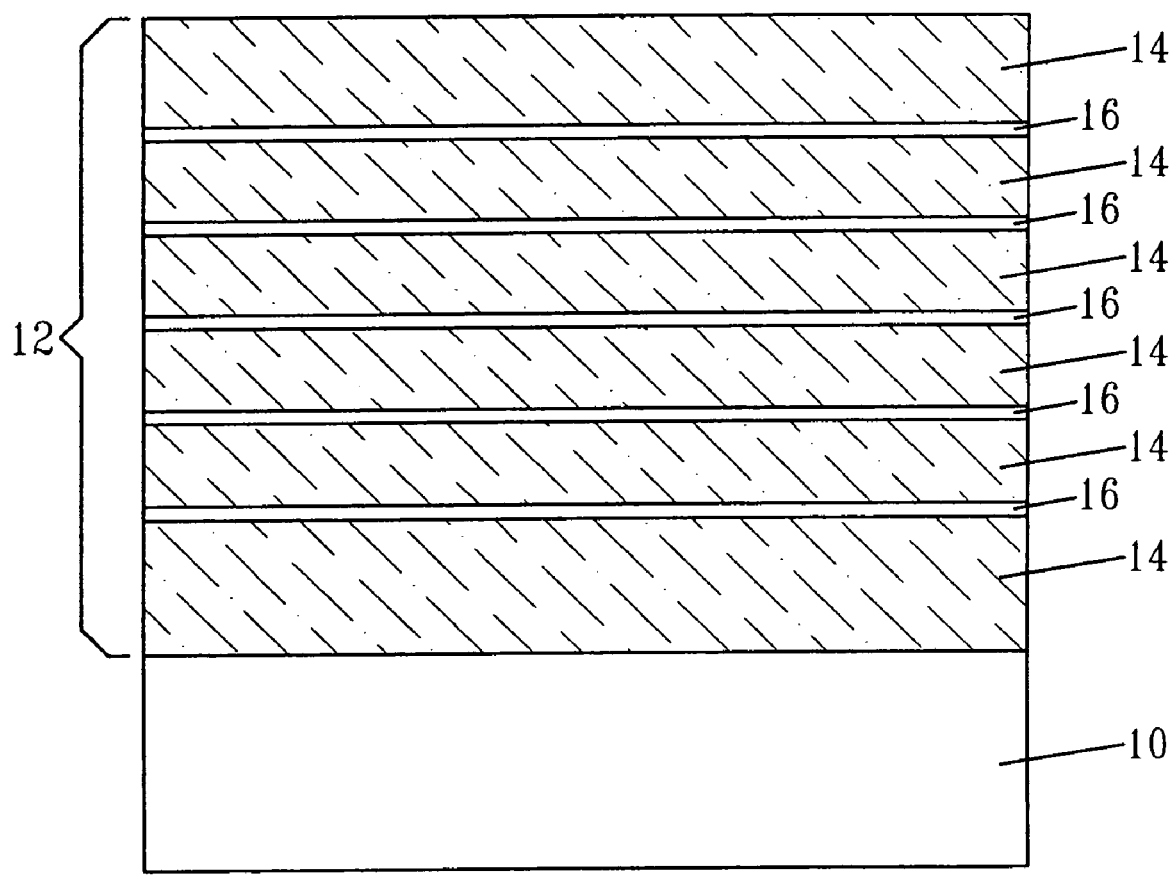
FIG. 1 is a pictorial representation (through a cross sectional view) illustrating the dielectric stack of the present invention.

The present invention, which provides a dielectric stack comprising one or more low k dielectric materials with improved mechanical properties (including crack velocity, stress, elongation modulus and hardness) as well as a method of fabricating the same, will now be described in greater detail by referring to the drawings that accompany the present application. The various drawings are provided for illustrative purposes and thus they are not drawn to scale.

It is noted that the description that follows discusses the formation of a dielectric stack including nanolayers imbedded within one or more low k dielectric films. Although dielectric stack formation is described and illustrated, the incorporation of nanolayers within other films that are highly susceptible to cracking is also contemplated herein. In that instance, the dielectric precursor described below is substituted with any conventional material precursor, such as a metal-containing precursor. During deposition of the other material, the material precursor is changed to a nanolayer precursor to form the nanolayer, and after nanolayer formation a material precursor (same or different from the first one) is again used.

Reference is made first to FIG. 1 which illustrates a structure that is provided after forming the inventive low k (dielectric constant of about 3.0 or less, preferably 2.7 or less) dielectric stack 12 on a surface of a substrate 10. The term "substrate" when used in conjunction with substrate 10 includes, a semiconducting material, an insulating material, a conductive material or any combination thereof, including multilayered structures. Thus, for example, substrate 10 can be a semiconducting material such as Si, SiGe, SiGeC, SiC, GaAs, InAs, InP and other III/V or II/VI compound semiconductors. The semiconductor substrate 10 can also include a layered substrate such as, for example, Si/SiGe, Si/SiC, silicon-on-insulators (SOIs) or silicon germanium-on-insulators (SGOIs).

When substrate 10 is an insulating material, the insulating material can be an organic insulator, an inorganic insulator or a combination thereof including multilayers. When the substrate 10 is a conductive material, the substrate 10 may include, for example, polySi, an elemental metal, alloys of elemental metals, a metal silicide, a metal nitride and combinations thereof, including multilayers.

In some embodiments, the substrate 10 includes a combination of a semiconducting material and an insulating material, a combination of a semiconducting material and a conductive material or a combination of a semiconducting material, an insulating material and a conductive material.

When the substrate 10 comprises a semiconductor material, one or more semiconductor devices such as complementary metal oxide semiconductor (CMOS) devices can be fabricated thereon. For clarity, the one or more semiconductor devices are not shown in the drawings of the present application.

The low k dielectric stack 12 can comprise any dielectric material having a dielectric constant of about 3.0 or less. Preferably, the low k dielectric stack 12 includes dielectric materials that have a dielectric constant of about 2.7 or less, with a dielectric constant of about 2.5 or less being more highly preferred. The term "dielectric stack" is used to denote a structure that includes at least one dielectric film (or material) having said low k value. In the illustration shown in FIG. 1, the dielectric stack 12 includes six film layers 14 wherein a nanolayer 16 separates each of the film layers. This illustration is exemplary and by no means restrictions the number of dielectric films or nanolayers that can be present within the inventive dielectric stack. The dielectric materials within the film stack can comprise the same or different, preferably the same, low k dielectric material.

The low k dielectric films that can be present within the stack 12 can be porous, nonporous or a combination of porous and non-porous. When porous dielectric films are employed, the dielectric constant thereof is less than the nonporous version of the same dielectric film. Preferably, each of the low k dielectric films (or materials) within the stack are porous. The pores are typically formed by introducing a porogen during the deposition process that are removed after deposition using a curing process. In some embodiment, one of the precursors employed can be a porogen material.

Examples of dielectric films (or materials) that can be employed in the present invention include, but are not limited to: organic dielectrics containing atoms of C, O and H such as thermosetting polyarylene ethers; and/or inorganic dielectrics containing atoms of Si, O and H, with C being optional. Examples of the latter include carbon doped oxides (also referred to as "SiCOH"), silsesquioxanes, organosilanes and other like Si-containing materials. The term "polyarylene" is used herein to denote aryl moieties or inertly substituted aryl moieties which are linked together by bonds, fused rings, or inert linking groups such as oxygen, sulfur, sulfone, sulfoxide, carbonyl, etc.

The as deposited dielectric materials described above, without the inventive nanolayers, typically have poor mechanical properties associated therein. Specifically, the above described as deposited materials, without the nanolayers, have a crack velocity of about 1E-10 m/sec or greater at a film thickness of 1.2 μm, a stress of about 60 MPa or greater, a modulus of about 7.5 GPa or less and a hardness of about 1 GPa or less. These mechanical properties become poorer as the dielectric of the material is decreased. For instance, the crack velocity, stress, modulus and hardness of a porous low k material are worse than its corresponding nonporous low k material.

The dielectric stack 12 is deposited by placing the substrate 10 into a reactor chamber such as a plasma enhanced chemical vapor deposition (PECVD). In addition to PECVD, the present invention also contemplates that the dielectric stack 12 can be formed utilizing chemical vapor deposition (CVD), high-density plasma (HDP) deposition, pulsed PECVD, spin-on application, or other related methods. A dielectric material having a low k, as defined above, is then deposited as will be described in more detail herein below. During the deposition of the dielectric film(s) 14, the conditions are changed so that at least one nanolayer 16 comprising atoms of at least Si and O is formed. This is achieved by stopping the precursor flow and replacing the same with a nanolayer precursor flow. After forming the nanolayer, the nanolayer precursor flow is halted and dielectric precursor can then be introduced into the reactor. It is possible to switch the dielectric precursor after forming the nanolayer to provide a composition that is different from that of the previously formed dielectric layer.

The thickness of the dielectric stack 12 deposited may vary; typical ranges for the deposited low k dielectric stacks 12 are from about 50 nm to about 5 μm, with a thickness from 100 to about 1.5 μm being more typical.

The nanolayers 16 that are introduced into the film stack have a thickness that is within the nanometer range. Typically, the nanolayers 16 have a thickness from about 1 to about 100 nm, with a thickness from about 2 to about 10 nm being more typical. The nanolayers 16 of the present invention are in-situ nanolayers that include atoms of at least Si and O, with atoms of C, H, and N being optional. Illustrative examples of nanolayers of the present invention include SiCOH, SiCOHN, $SiO_2$, $SiCO_x$, SiON or multilayers thereof. The composition of each nanolayer within a given dielectric stack 12 may be the same or different.

After incorporating the nanolayers 16 with the dielectric material 14, the dielectric material within the inventive stack has a crack velocity of less than 1E-10 m/sec at 1.2 μm, typically from about 1E-8 to about 1E-10 m/sec, at a film thickness of 1.2 μm, a stress of less than 60 MPa, typically from about 30 to about 50 MPa, a modulus of greater than 7.5 GPa, typically from about 8 to about 13 GPa, and a hardness of greater than 1 GPa, typically from about 1.5 to about 2.0 GPa. The aforementioned values are for the as deposited material prior to subjecting the inventive stack to any post treatment steps. These values for the inventive stack including the imbedded nanolayers are an improvement over prior art as deposited dielectric films that do not contain any imbedded nanolayers.

Typically, the low k dielectric material 14 is a SiCOH dielectric that is deposited using the processing techniques disclosed in co-assigned U.S. Pat. Nos. 6,147,009, 6,312,793, 6,441,491, 6,437,443, 6,541,398, 6,479,110 B2, and 6,497,963, the contents of which are incorporated herein by reference.

Specifically, the SiCOH dielectric film is formed by providing at least a first precursor, e.g., the dielectric precursor, (liquid, gas or vapor) comprising atoms of Si, C, O, and H, and an inert carrier such as He or Ar, into a reactor, preferably the reactor is a PECVD reactor, and then depositing a film derived from said first precursor onto a suitable substrate utilizing conditions that are effective in forming a SiCOH dielectric material. The present invention yet further provides for mixing the first precursor with an oxidizing agent such as $O_2$, $CO_2$ or a combination thereof, thereby stabilizing the reactants in the reactor and improving the uniformity of the low k dielectric material deposited on the substrate 10.

In addition to the first precursor, a second precursor (gas, liquid or vapor) comprising atoms of C, H, and optionally O, F and N can be used. Optionally, a third precursor (gas, liquid or gas) comprising Ge may also be used.

Preferably, the first precursor is selected from organic molecules with ring structures comprising SiCOH components such as 1,3,5,7-tetramethylcyclotetrasiloxane ("TMCTS" or "$C_4H_{16}O_4Si_4$"), octamethylcyclotetrasiloxane (OMCTS), diethoxymethylsilane (DEMS), dimethyidimethoxysilane (DMDMOS), diethylmethoxysilane (DEDMOS), and related cyclic and non-cyclic silanes, siloxanes and the like.

The second precursor that may be used in forming a SiCOH low k dielectric is a hydrocarbon molecule. Although any hydrocarbon molecule such as, for example, ethylene, may be used, preferably the second precursor is selected from the group consisting of hydrocarbon molecules with ring structures, preferably with more than one ring present in the molecule or with branched chains attached to the ring. Especially useful, are species containing fused rings, at least one of which contains a heteroatom, preferentially oxygen. Of these species, the most suitable are those that include a ring of a size that imparts significant ring strain, namely rings of 3 or 4 atoms and/or 7 or more atoms. Particularly attractive, are members of a class of compounds known as oxabicyclics, such as cyclopentene oxide ("CPO" or "$C_5H_8O$"). Also useful are molecules containing branched tertiary butyl (t-butyl) and isopropyl (i-propyl) groups attached to a hydrocarbon ring; the ring may be saturated or unsaturated (containing C═C double bonds). The third precursor may be formed from germane hydride or any other reactant comprising a source Ge.

In a preferred embodiment of the present invention, the SiCOH dielectric film, which is used as the low k dielectric within the inventive stack may be deposited using a method the includes the step of providing a parallel plate reactor, which has a conductive area of a substrate chuck between about 85 $cm^2$ and about 750 $cm^2$, and a gap between the substrate and a top electrode between about 1 cm and about 12 cm. A high frequency RF power is applied to one of the electrodes at a frequency between about 0.45 MHz and about 200 MHz. Optionally, an additional low frequency power can be applied to one of the electrodes.

The conditions used for the deposition step may vary depending on the desired final dielectric constant of the SiCOH dielectric film. Broadly, the conditions used for providing a stable dielectric material comprising elements of Si, C, O and H that has a dielectric constant of about 2.7 or less include: setting the substrate temperature at between about 200° C. and about 425° C.; setting the high frequency RF power density at between about 0.1 $W/cm^2$ and about 2.5 $W/cm^2$; setting the first liquid precursor flow rate at between about 100 mg/min and about 5000 mg/min, optionally setting the second liquid precursor flow rate at between about 50 mg/min to about 10,000 mg/min; optionally setting the third liquid precursor flow rate at between about 25 mg/min to about 4000 mg/min; optionally setting the inert carrier gases such as helium (and/or argon) flow rate at between about 50 sccm to about 5000 sccm; setting the reactor pressure at a pressure between about 1000 mTorr and about 7000 mTorr; and setting the high frequency RF power between about 75 W and about 1000 W. Optionally, a low frequency power may be added to the plasma between about 30 W and about 400 W. When the conductive area of the substrate chuck is changed by a factor of X, the RF power applied to the substrate chuck is also changed by a factor of X.

When an oxidizing agent is employed in the present invention, it is flown into the PECVD reactor at a flow rate between about 10 sccm to about 1000 sccm.

While liquid precursors are used in the above example, it is known in the art that the organosilicon gas phase precursors (such as trimethylsilane) can also be used for the deposition. A porogen can be included during the deposition of the low k dielectric film 12 that causes subsequent pore formation within the film 12 during a subsequent curing step.

In a preferred embodiment of the present invention, the low k dielectric film within the stack is a hydrogenated oxidized silicon carbon material (e.g., SiCOH) comprising atoms of Si, C, O and H in a covalently bonded tri-dimensional network and having a dielectric constant of not more than about 2.8. The tri-bonded network may include a covalently bonded tri-dimensional ring structure comprising Si—O, Si—C, Si—H, C—H and C—C bonds. The term "tri-dimensional" is used to describe a polymeric structure in which the Si, C, O and H atoms are interconnected and interrelated in the x, y and z directions The low k dielectric film 14 within the inventive stack 12 may comprise F and N and may optionally have the Si atoms partially substituted by Ge atoms. The low k dielectric film 14 may contain molecular scale voids (i.e., nanometer-sized pores) of between about 0.3 to about 50 nanometers in diameter, and most preferably between about 0.4 and about 10 nanometers in diameter, further reducing the dielectric constant of the film to values below about 2.0. The nanometer-sized pores of the low k dielectric film 14 occupy a volume of between about 0.5% and about 50% of a volume of the material.

When the low k dielectric film 14 is a SiCOH dielectric, it typically comprises between about 5 and about 40 atomic percent of Si; between about 5 and about 45 atomic percent of C; between 0 and about 50 atomic percent of O; and between about 10 and about 55 atomic percent of H.

The nanolayers are introduced during the deposition of the low k dielectric film 14 by changing the precursor being introduced into the reactor chamber to one that is capable of forming the inventive nanolayer. Specifically, the nanolayer precursor comprises a solid, liquid or gas that includes atoms of at least, Si, or Si and O, with C, N and H being optional. Examples of nanolayer precursors include 1,3,5,7-tetramethylcyclotetrasiloxane ("TMCTS" or "$C_4H_{16}O_4Si_4$"), octamethylcyclotetrasiloxane (OMCTS), diethoxymethylsilane (DEMS), dimethyidimethoxysilane (DMDMOS), diethylmethoxysilane (DEDMOS), silane, hexamethyl disilazane (HMDS) or related cyclic and non-cyclic silanes and siloxanes.

The nanolayer precursor may be used in conjunction with an inert gas and/or an oxidizing agent. The inert gas and the oxidizing agent can be the same as described above.

The conditions used for forming the nanolayer include: setting the substrate temperature at between about 200° C. and about 425° C.; setting the high frequency RF power density at between about 0.1 $W/cm^2$ and about 2.5 $W/cm^2$; setting the nanolayer precursor flow rate at between about 600 mg/min and about 2500 mg/min; optionally setting the inert carrier gases such as helium (and/or argon) flow rate at between about 50 sccm to about 5000 sccm; optionally setting the oxidizing agent flow rate at about 600 to about 2500 sccm; setting the reactor pressure at a pressure between about 1000 mTorr and about 7000 mTorr; and setting the high frequency RF power between about 75 W and about 1000 W. Optionally, a low frequency power may be added to the plasma between about 30 W and about 400 W.

As indicated above the inventive (as deposited) dielectric stack has improved mechanical properties, in terms of crack velocity, stress, modulus and hardness as compared to an equivalent (as deposited) dielectric stack that does not include any nanolayers imbedded therein. Further improvement in mechanical properties can be achieved by subjecting the same to a post treatment step. The post treatment step is optional and does not need to be performed with the inventive dielectric stack 12.

If desired, post treatment of the inventive dielectric stack 12 may be performed by utilizing an energy source such as thermal, electron beam, plasma, microwave or optical radiation such as UV or laser. Combinations of the aforementioned energy sources can also be used in the present invention.

The thermal energy source includes any source such as, for example, a heating element or a lamp, that can heat the deposited dielectric stack 12 to a temperature up to 450° C. More preferably, the thermal energy source is capable of heating the SiCOH dielectric stack 12 to a temperature from about 200° to about 450° C., with a temperature from about 350° C. to about 425° C. being even more preferred. This thermal treatment process can be carried out for various time periods, with a time period from about 0.5 minutes to about 300 minutes being typical. The thermal treatment step is typically performed in the presence of an inert gas such as He, Ar, Ne, Xe, $N_2$ or a mixture thereof. The thermal treatment step may be referred to as an anneal step in which rapid thermal anneal, furnace anneal, laser anneal or spike anneal conditions are employed.

In some embodiments, the thermal treatment step can be performed in the presence of a gas mixture containing a hydrogen source gas such as, for example, $H_2$ or a hydrocarbon. In yet other embodiments, the thermal treatment step can be performed in the presence of a gas mixture containing a very low partial pressure of $O_2$ and $H_2O$, in the range below 1000 parts per million.

The UV light treatment step is performed utilizing a source that can generate light having a wavelength from about 500 to about 150 nm, to irradiate the substrate while the wafer temperature is maintained at up to 450° C., with temperatures from 200° C.-450° C. being preferred and a temperature from 350° C. to 425° C. being even more highly preferred. Radiation with >370 nm is of insufficient energy to dissociate or activate important bonds, so the wavelength range 150-370 nm is a preferred range. Using literature data and absorbance spectra measured on as deposited films, it has been found that <170 nm radiation may not be favored due to degradation of the dielectric material within the dielectric stack. Further, the energy range 310-370 nm is less useful than the range 150-310 nm, due to the relatively low energy per photon from 310-370 nm. Within the 150-310 nm range, optimum overlap with the absorbance spectrum of the as deposited stack and minimum degradation of the film properties within the stack (such as hydrophobicity) may be optionally used to select a most effective region of the UV spectrum for changing the dielectric's properties.

The UV light treatment step may be performed in an inert gas, a hydrogen source gas or a gas mixture of $O_2$ and $H_2O$ using the partial pressure range mentioned above.

The electron beam treatment step is performed utilizing a source that is capable of generating a uniform electron flux over the wafer, with energies from 0.5 to 25 keV and current densities from 0.1 to 100 microAmp/cm$^2$ (preferably 1 to 5 microAmp/cm$^2$), while the wafer temperature is maintained at a temperature up to 450° C., with temperatures from 200°-450° C. being preferred, and temperature from 350° to 425° being even more highly preferred. The preferred dose of electrons used in the electron beam treatment step is from 50 to 500 microcoulombs/cm$^2$, with 100 to 300 microcoulombs/cm$^2$ range being preferred.

The electron beam treatment step may be performed in an inert gas, a hydrogen source gas or a gas mixture of $O_2$ and $H_2O$ using the partial pressure range mentioned above.

The plasma treatment step is performed utilizing a source that is capable of generating atomic hydrogen (H), and optionally $CH_3$ or other hydrocarbon radicals. Downstream plasma sources are preferred over direct plasma exposure. During plasma treatment the wafer temperature is maintained at a temperature up to 450° C., with temperatures from 200° C.-450° C. being preferred and temperatures from 350° C. to 425° C. being more highly preferred.

The plasma treatment step is performed by introducing a gas into a reactor that can generate a plasma and thereafter it is converted into a plasma. The gas that can be used for the plasma treatment includes inert gases such as Ar, N, He, Xe or Kr, with He being preferred; hydrogen or related sources of atomic hydrogen, methane, methylsilane, related sources of $CH_3$ groups, and mixtures thereof. The flow rate of the plasma treatment gas may vary depending on the reactor system being used. The chamber pressure can range anywhere from 0.05 to 20 Torr, but the preferred range of pressure operation is 1 to 10 Torr. The plasma treatment step occurs for a period of time, which is typically from about ½ to about 10 minutes, although longer times may be used within the invention.

An RF or microwave power source is typically used to generate the above plasma. The RF power source may operate at either a high frequency range (on the order of about 100 W or greater); a low frequency range (less than 250 W) or a combination thereof may be employed. The high frequency power density can range anywhere from 0.1 to 2.0 W/cm$^2$ but the preferred range of operation is 0.2 to 1.0 W/cm$^2$. The low frequency power density can range anywhere from 0.1 to 1.0 W/cm$^2$ but the preferred range of operation is 0.2 to 0.5 W/cm$^2$. The chosen power levels must be low enough to avoid significant sputter etching of the exposed dielectric surface (<5 nanometers removal).

In addition to the above, a deep ultra-violet (DUV) laser source can also be employed. The laser source used to treat the deposited films is typically an excimer laser which operates at one of several DUV wavelengths depending on the laser gas mixture. For example, a XeF laser which produces 308 nm radiation can be employed. Also, a KrF laser that produces 248 nm radiation, or a ArF laser that produces 193 nm radiation can be employed in the present invention. Excimer lasers can operate at several hundred pulses per second with pulse energies up to a joule (J) resulting in several hundred Watt (W) output.

The laser employed in treating the as deposited films preferably operates under a pulse mode. The laser beam can be expanded to expose the entire sample. Alternatively, and for larger samples, the laser exposure area can be raster scanned across the sample to provide uniform dose. Using excimer lasers, the fluence is limited to less than 5 mJ/cm$^2$ per pulse to ensure ablation will not occur. The short pulse duration of about 10 ns for the excimer laser can cause material ablation at fluence levels greater than 20 mJ/cm$^2$. Typically, laser fluence levels of 0.1-5 mJ/cm$^2$ per pulse are employed. The total dose can vary from 1 to 10000 Joules/cm$^2$, preferably 500-2000 J/cm$^2$. This is achieved by multiple laser pulse exposure. For example, a dose of 1000 J/cm$^2$ can be obtained using a fluence of 1 mJ/cm$^2$ for duration of 10$^6$ pulses. Excimer laser normally operates at a few hundreds pulses per second. Depending of the total dosage required, the overall exposure time period for the DUV laser treatment for a several seconds to hours. A typical 500 J/cm$^2$ dose is achieved in less than 15 min using a 200 Hz laser operating at a fluence level of 3 mJ/cm$^2$ per pulse.

The above described treatment steps are optional and need not be performed to achieve a dielectric film that has good electronic and mechanical properties. The above treatments however can be used with the inventive dielectric stack without significantly impacting the electrical and mechanical properties of the dielectric film.

The electronic devices which can include the inventive dielectric stack are shown in FIGS. 2-5. It should be noted that the devices shown in FIGS. 2-5 are merely illustrative examples of the present invention, while an infinite number of other devices may include the inventive dielectric stack. In the following drawings, the nanolayers are not specifically shown within the dielectric stack of the present invention, but nevertheless nanolayers are meant to be included with layers that are referred to as the inventive dielectric stack.

Figure 2:
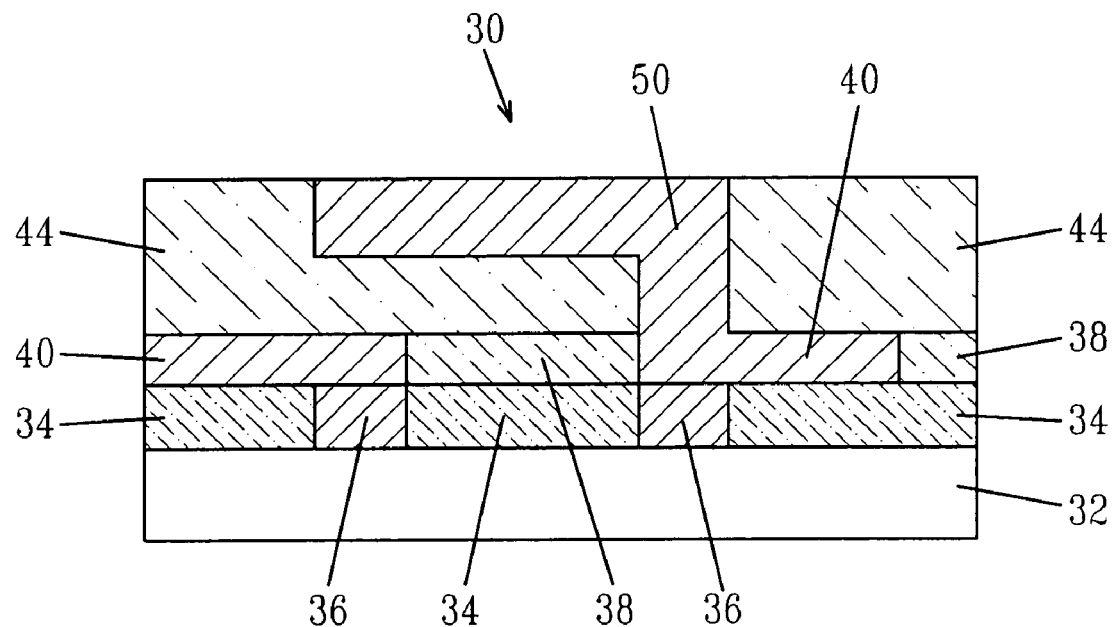
FIG. 2 is an enlarged, cross-sectional view of an electronic device of the present invention that includes the inventive low k dielectric stack as both the intralevel dielectric layer and the interlevel dielectric layer.

In FIG. 2, an electronic device 30 built on a silicon substrate 32 is shown. On top of the silicon substrate 32, an insulating material layer 34 is first formed with a first region of metal 36 embedded therein. After a CMP process is conducted on the first region of metal 36, a dielectric stack 38 of the present invention is deposited on top of the first layer of insulating material 34 and the first region of metal 36. The first layer of insulating material 34 may be suitably formed of silicon oxide, silicon nitride, doped varieties of these materials, or any other suitable insulating materials. The dielectric stack 38 is then patterned in a photolithography process followed by etching and a conductor layer 40 is deposited thereon. After a CMP process on the first conductor layer 40 is carried out, a second layer of the inventive dielectric stack 44 is deposited by a plasma enhanced chemical vapor deposition process overlying the first dielectric stack 38 and the first conductor layer 40. The conductor layer 40 may be deposited of a metallic material or a nonmetallic conductive material. For instance, a metallic material of aluminum or copper, or a nonmetallic material of nitride or polysilicon. The first conductor 40 is in electrical communication with the first region of metal 36.

A second region of conductor 50 is then formed after a photolithographic process on the dielectric stack 44 is conducted followed by etching and then a deposition process for the second conductor material. The second region of conductor 50 may also be deposited of either a metallic material or a nonmetallic material, similar to that used in depositing the first conductor layer 40. The second region of conductor 50 is in electrical communication with the first region of conductor 40 and is embedded in the second layer of the dielectric stack 44. The second layer of the dielectric stack 44 is in intimate contact with the first layer of the dielectric stack 38. In this example, the first layer of the dielectric stack 38 is an intralevel dielectric material, while the second layer of the dielectric stack 44 is both an intralevel and an interlevel dielectric. Based on the low dielectric constant of the inventive dielectric stacks, superior insulating property can be achieved by the first insulating layer 38 and the second insulating layer 44.

Figure 3:
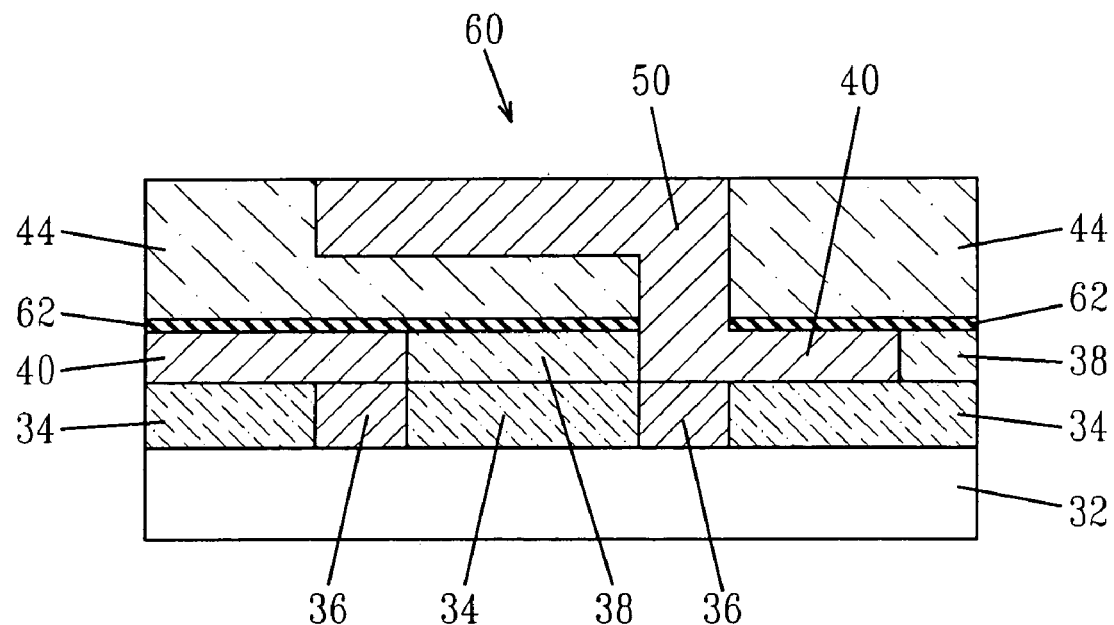
FIG. 3 is an enlarged, cross-sectional view of the electronic structure of FIG. 2 having an additional diffusion barrier dielectric cap layer deposited on top of the inventive dielectric stack.

FIG. 3 shows a present invention electronic device 60 similar to that of electronic device 30 shown in FIG. 2, but with an additional dielectric cap layer 62 deposited between the first insulating material layer 38 and the second insulating material layer 44. The dielectric cap layer 62 can be suitably formed of a material such as silicon oxide, silicon nitride, silicon oxynitride, refractory metal silicon nitride with the refractory metal being Ta, Zr, Hf or W, silicon carbide, silicon carbo-nitride (SiCN), silicon carbo-oxide (SiCO), and their hydrogenated compounds. The additional dielectric cap layer 62 functions as a diffusion barrier layer for preventing diffusion of the first conductor layer 40 into the second insulating material layer 44 or into the lower layers, especially into layers 34 and 32.

Figure 4:
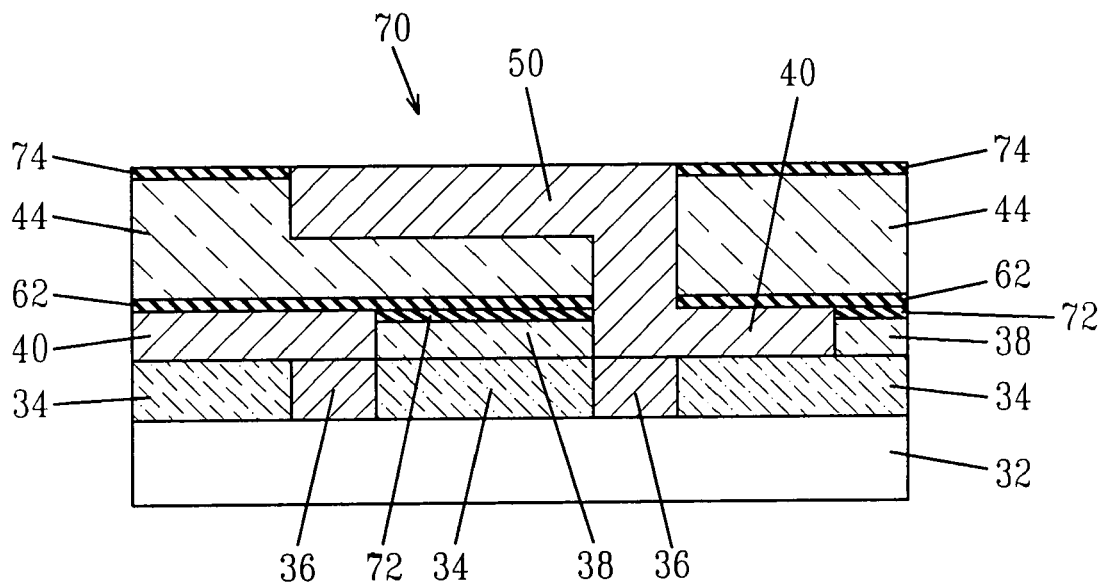
FIG. 4 is an enlarged, cross-sectional view of the electronic structure of FIG. 3 having an additional RIE hard mask/polish-stop dielectric cap layer and a dielectric cap diffusion barrier layer deposited on top of the polish-stop layer.

Another alternate embodiment of the present invention electronic device 70 is shown in FIG. 4. In the electronic device 70, two additional dielectric cap layers 72 and 74 which act as a RIE mask and CMP (chemical mechanical polishing) polish stop layer are used. The first dielectric cap layer 72 is deposited on top of the first dielectric stack 38 and is used as a RIE mask and CMP stop, so the first conductor layer 40 and layer 72 are approximately co-planar after CMP. The function of the second dielectric layer 74 is similar to layer 72, however layer 74 is utilized in planarizing the second conductor layer 50. The polish stop layer 74 can be deposited of a suitable dielectric material such as silicon oxide, silicon nitride, silicon oxynitride, refractory metal silicon nitride with the refractory metal being Ta, Zr, Hf or W, silicon carbide, silicon carbo-oxide (SiCO), and their hydrogenated compounds. A preferred polish stop layer composition is SiCH or SiCOH for layers 72 or 74. A second dielectric layer 74 can be added on top of the second dielectric stack 44 for the same purposes.

Figure 5:
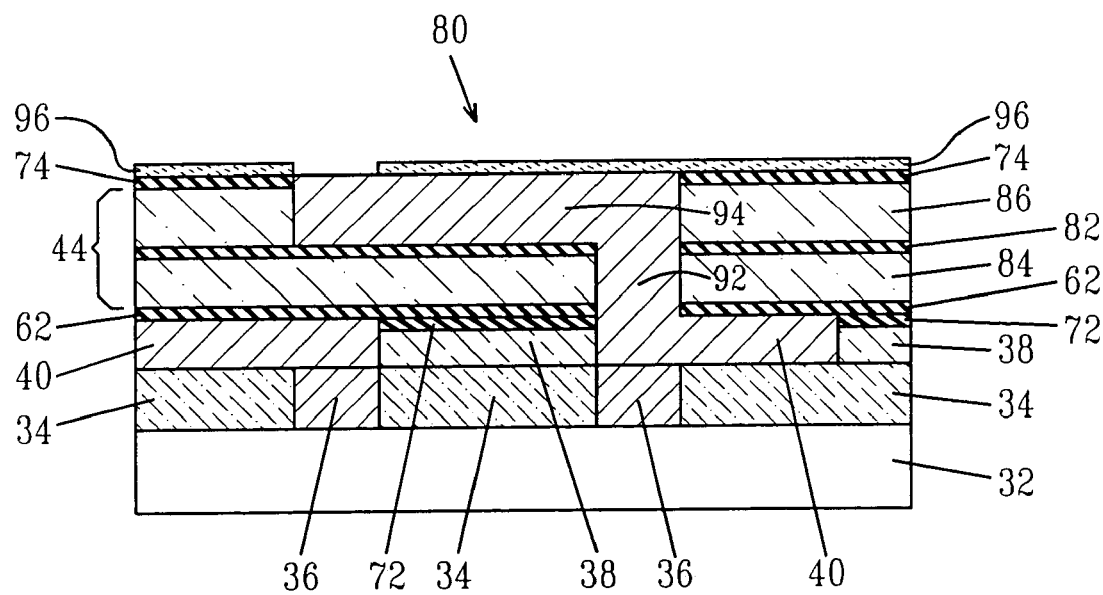
FIG. 5 is an enlarged, cross-sectional view of the electronic structure of FIG. 4 having additional RIE hard mask/polish-stop dielectric layers deposited on top of the dielectric stack of the present invention.

Still another alternate embodiment of the present invention electronic device 80 is shown in FIG. 5. In this alternate embodiment, an additional layer 82 of dielectric material is deposited and thus dividing the second insulating material layer 44 into two separate layers 84 and 86. The intralevel and interlevel dielectric layer 44 formed of the inventive dielectric stack is therefore divided into an interlayer dielectric layer 84 and an intralevel dielectric layer 86 at the boundary between via 92 and interconnect 94. An additional diffusion barrier layer 96 is further deposited on top of the upper dielectric layer 74. The additional benefit provided by this alternate embodiment electronic structure 80 is that dielectric layer 82 acts as an RIE etch stop providing superior interconnect depth control. Thus, the composition of layer 82 is selected to provide etch selectivity with respect to layer 86.

Still other alternate embodiments may include an electronic structure which has layers of insulating material as intralevel or interlevel dielectrics in a wiring structure that includes a pre-processed semiconducting substrate which has a first region of metal embedded in a first layer of insulating material, a first region of conductor embedded in a second layer of the insulating material wherein the second layer of insulating material is in intimate contact with the first layer of insulating material, and the first region of conductor is in electrical communication with the first region of metal, a second region of conductor in electrical communication with the first region of conductor and is embedded in a third layer of insulating material, wherein the third layer of insulating material is in intimate contact with the second layer of insulating material, a first dielectric cap layer between the second layer of insulating material and the third layer of insulating material and a second dielectric cap layer on top of the third layer of insulating material, wherein the first and the second dielectric cap layers are formed of a material that includes the inventive dielectric stack of the present invention.

Still other alternate embodiments of the present invention include an electronic structure which has layers of insulating material as intralevel or interlevel dielectrics in a wiring structure that includes a pre-processed semiconducting substrate that has a first region of metal embedded in a first layer of insulating material, a first region of conductor embedded in a second layer of insulating material which is in intimate contact with the first layer of insulating material, the first region of conductor is in electrical communication with the first region of metal, a second region of conductor that is in electrical communication with the first region of conductor and is embedded in a third layer of insulating material, the third layer of insulating material is in intimate contact with the second layer of insulating material, and a diffusion barrier layer formed of the dielectric stack of the present invention deposited on at least one of the second and third layers of insulating material.

Still other alternate embodiments include an electronic structure which has layers of insulating material as intralevel or interlevel dielectrics in a wiring structure that includes a pre-processed semiconducting substrate that has a first region of metal embedded in a first layer of insulating material, a first region of conductor embedded in a second layer of insulating material which is in intimate contact with the first layer of insulating material, the first region of conductor is in electrical communication with the first region of metal, a second region of conductor in electrical communication with the first region of conductor and is embedded in a third layer of insulating material, the third layer of insulating material is in intimate contact with the second layer of insulating material, a reactive ion etching (RIE) hard mask/polish stop layer on top of the second layer of insulating material, and a diffusion barrier layer on top of the RIE hard mask/polish stop layer, wherein the RIE hard mask/polish stop layer and the diffusion barrier layer are formed of the dielectric stack of the present invention.

Still other alternate embodiments include an electronic structure which has layers of insulating materials as intralevel or interlevel dielectrics in a wiring structure that includes a pre-processed semiconducting substrate that has a first region of metal embedded in a first layer of insulating material, a first region of conductor embedded in a second layer of insulating material which is in intimate contact with the first layer of insulating material, the first region of conductor is in electrical communication with the first region of metal, a second region of conductor in electrical communication with the first region of conductor and is embedded in a third layer of insulating material, the third layer of insulating material is in intimate contact with the second layer of insulating material, a first RIE hard mask, polish stop layer on top of the second layer of insulating material, a first diffusion barrier layer on top of the first RIE hard mask/polish stop layer, a second RIE hard mask/polish stop layer on top of the third layer of insulating material, and a second diffusion barrier layer on top of the second RIE hard mask/polish stop layer, wherein the RIE hard mask/polish stop layers and the diffusion barrier layers are formed of the dielectric stack of the present invention.

Still other alternate embodiments of the present invention includes an electronic structure that has layers of insulating material as intralevel or interlevel dielectrics in a wiring structure similar to that described immediately above but further includes a dielectric cap layer which is formed of the dielectric stack of the present invention situated between an interlevel dielectric layer and an intralevel dielectric layer.

It should be noted that the present invention also contemplates other material stacks besides those including low k dielectrics. In that instance, the present invention provides a material stack comprising one or more films that have a crack velocity of about 1E-10 m/sec or greater and at least one monolayer within said one or more films, said one at least one monolayer reduces said crack velocity of said one or more films to a value of less than 1E-10 m/sec.

In this embodiment, the stack is made as using the method described above except that the first dielectric precursor is replaced with a first material precursor. For example, a metal stack formed on a metal oxide substrate can be provided in which the metal stack is comprised of Au deposited from an Au-containing precursor.

While the present invention has been particularly shown and described with respect to preferred embodiments thereof, it will be understood by those skilled in the art that the foregoing and other changes in forms and details may be made without departing from the spirit and scope of the present invention. It is therefore intended that the present invention not be limited to the exact forms and details described and illustrated, but fall within the scope of the appended claims.

What is claimed is:

1. A dielectric stack comprising at least one dielectric material, having a dielectric constant of about 3.0 or less, said at least one dielectric material having at least one nanolayer including atoms of Si and O and having a thickness from about 2 to about 10 nm embedded within the at least one dielectric material wherein said at least one dielectric material including said at least one nanolayer has a lower crack velocity at a given thickness as compared to said at least one dielectric material not including said at least one nanolayer as said given thickness.

2. The dielectric stack of claim 1 wherein said at least one dielectric material is selected from the group consisting of an organic dielectric comprising at least atoms of C, O and H; an inorganic dielectric comprising atoms of Si, O, and H, with C being optional; and mixtures and multilayers thereof.

3. The dielectric stack of claim 1 wherein said at least one dielectric material comprises an inorganic dielectric comprising atoms of Si, C, O and H that are bonded within a tri-dimensional network structure.

4. The dielectric stack of claim 1 wherein said at least one dielectric material is porous, nonporous or a combination thereof.

5. The dielectric stack of claim 1 wherein said at least one nanolayer further comprises atoms of C, N and H.

6. The dielectric stack of claim 1 wherein said at least one nanolayer comprises SiCOH, SiCOHN, $SiO_2$, $SiCO_x$, or SiON.

7. The dielectric stack of claim 1 wherein said at least one dielectric material including said at least one nanolayer has a crack velocity of less than 1E-10 m/sec at 1.2 µm.

8. The dielectric stack of claim 1 wherein said at least one dielectric material including said at least one nanolayer has a stress of less than 60 MPa, a modulus of greater than 7.5 GPa and a hardness of greater than 1.0.

9. An interconnect structure located on a substrate comprising at least a dielectric stack including at least one dielectric material having a dielectric constant of about 3.0 or less, said at least one dielectric material comprising at least one nanolayer including atoms of Si and O and having a thickness of about 2 to about 10 nm embedded within the at least one dielectric material, wherein said at least one dielectric material including said at least one nanolayer has a lower crack velocity at a given thickness as compared to said at least one dielectric material not including said at least one nanolayer as said given thickness.

10. The interconnect structure of claim 9 wherein said dielectric stack is an interlevel dielectric, an intralevel dielectric, a capping layer, a hardmask/polish stop layer or any combination thereof.

11. The interconnect structure of claim 9 wherein said at least one dielectric material is selected from the group consisting of an organic dielectric comprising at least atoms of C, O and H; an inorganic dielectric comprising atoms of Si, O, and H, with C being optional; and mixtures and multilayers thereof.

12. The interconnect structure of claim 9 wherein said at least one dielectric material comprises an inorganic dielectric comprising atoms of Si, C, O and H that are bonded within a tri-dimensional network structure.

13. The interconnect structure of claim 9 wherein said at least one nanolayer further comprises atoms of C, N and H.

14. The interconnect structure of claim 9 wherein said at least one nanolayer comprises SiCOH, SiCOHN, $SiO_2$, $SiCO_x$ or SiON.

15. The interconnect structure of claim 9 wherein said at least one dielectric material including said at least one nanolayer has a crack velocity of less than 1E-10 m/sec at 1.2 µm.

16. The interconnect structure of claim 9 wherein said at least one dielectric material including said at least one nanolayer has a stress of less than 60 MPa, a modulus of greater than 7.5 GPa and a hardness of greater than 1.0.

* * * * *